United States Patent
Hirler et al.

(10) Patent No.: US 8,044,460 B2
(45) Date of Patent: Oct. 25, 2011

(54) ELECTRONIC DEVICE WITH CONNECTING STRUCTURE

(75) Inventors: Franz Hirler, Isen (DE); Markus Zundel, Egmating (DE)

(73) Assignee: Infineon Technologies Austria AG, Villach (AT)

( * ) Notice: Subject to any disclaimer, the term of this patent is extended or adjusted under 35 U.S.C. 154(b) by 650 days.

(21) Appl. No.: 11/947,552

(22) Filed: Nov. 29, 2007

(65) Prior Publication Data

US 2008/0128803 A1   Jun. 5, 2008

(30) Foreign Application Priority Data

Dec. 1, 2006   (DE) .................. 10 2006 056 809

(51) Int. Cl.
   *H01L 29/772*   (2006.01)
(52) U.S. Cl. ........ 257/331; 257/202; 257/330; 257/332; 257/E29.121; 257/E29.122; 257/E29.131; 438/270
(58) Field of Classification Search .......... 257/328–332, 257/E29.027, E29.118, E29.121, E29.122, 257/E29.131, E29.257, E29.262, 202–211; 438/270
   See application file for complete search history.

(56) References Cited

U.S. PATENT DOCUMENTS

| | | |
|---|---|---|
| 4,754,310 A | 6/1988 | Coe |
| 4,941,026 A | 7/1990 | Temple |
| 5,637,898 A | 6/1997 | Baliga |
| 5,864,159 A | 1/1999 | Takahashi |
| 6,525,375 B1 * | 2/2003 | Yamaguchi et al. .......... 257/341 |
| 6,545,316 B1 * | 4/2003 | Baliga .......................... 257/329 |
| 6,885,062 B2 | 4/2005 | Zundel et al. |
| 2004/0010036 A1 | 1/2004 | Rogovoy et al. |
| 2004/0015036 A1 | 1/2004 | Forrester |
| 2005/0017293 A1 | 1/2005 | Zundel et al. |
| 2005/0032287 A1 | 2/2005 | Nakazawa et al. |
| 2005/0167742 A1 | 8/2005 | Challa et al. |
| 2006/0017056 A1 | 1/2006 | Hirler |

FOREIGN PATENT DOCUMENTS

| | | |
|---|---|---|
| DE | 10207309 | 9/2003 |
| DE | 102004029435 | 1/2006 |
| EP | 1168455 | 1/2002 |
| EP | 1610390 | 12/2005 |

* cited by examiner

*Primary Examiner* — Kenneth Parker
*Assistant Examiner* — John Lin
(74) *Attorney, Agent, or Firm* — Dicke, Billig & Czaja, PLLC

(57) ABSTRACT

A connecting structure for an electronic device includes an edge region of the device, a first trench and a second trench running toward the edge region, a first electrode within the first trench, and a second electrode within the second trench, the first and second electrodes being arranged in a same electrode plane with regard to a main surface of a substrate of the electronic device within the trenches, and the first electrode extending, at an edge region side end of the first trench, farther toward the edge region than the second electrode extends, at an edge region side end of the second trench, toward the edge region.

11 Claims, 12 Drawing Sheets

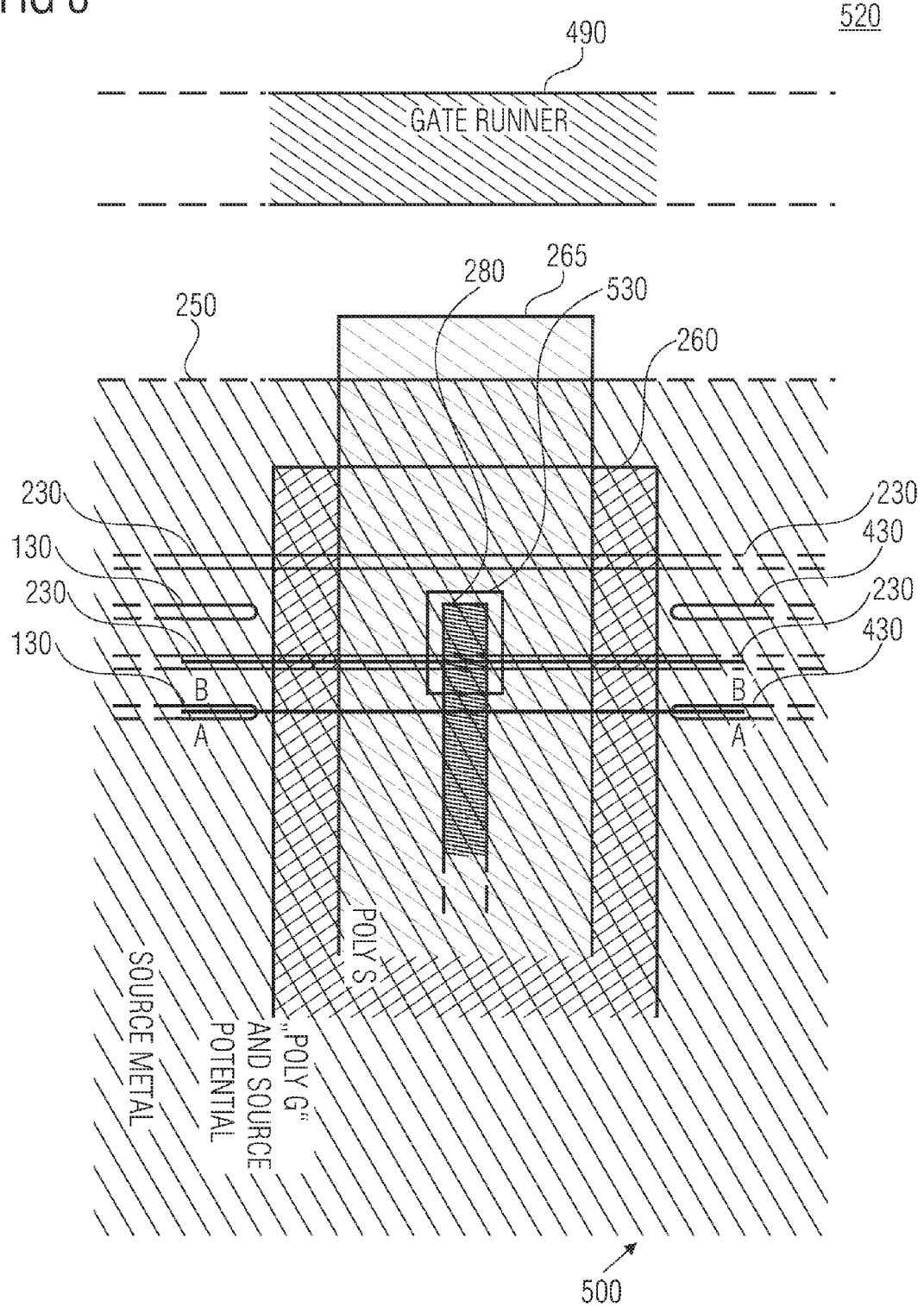

ELECTRONIC DEVICE WITH CONNECTING STRUCTURE

CROSS-REFERENCE TO RELATED APPLICATIONS

This application claims priority from German Patent Application No. 10 2006 056 809.5, which was filed on Dec. 1, 2006, and is incorporated herein in its entirety by reference.

BACKGROUND

One aspect relates to a connecting structure for an electronic device, and to a connecting structure for a semiconductor device including a trench structure, such as a vertical trench field-effect transistor, or trench-gate transistor, a trench capacitor, or trench capacitance, or a DMOS (double diffused metal oxide semiconductor) power transistor comprising a respective trench structure.

In many modern devices, including semiconductor devices, the construction space available for a specific device is a set constraint in the context of developing such devices. Especially with small semiconductor devices having typical chip edge lengths of 2 mm and less, the surface area which has to be provided for contacting the finished device represents a substantial proportion of the overall surface area of the device. In this context, bondpads frequently need to include a surface area of up to 500 µm×500 µm, for example to enable, in the context of a common bond processing step, contacting between the respective bondpad and the housing via more than one bondwire, or contact wire.

Even in the case of other contacting methods, for example by means of pressing contacts or resilient pins, the respective contacting area cannot be designed to be significantly smaller. If, typically, for example, three bondwires having diameters of 50 to 100 µm in each case are used per bondpad, the respective bondpad may hardly be designed to be smaller than 300 µm×300 µm. Also, there are conductor-line structures on the semiconductor device which are for electrically contacting the semiconducting structures and cells. In the context of development, the surface area necessary for this is not available, or is available only to a highly limited extent, for the actual cell structure of the semiconducting device.

The connecting structures for operation thus considerably restrict the surface area available for the cell structure of the semiconducting device. With regard to the overall surface area of the device, the space requirements of the contacting connecting structures considerably reduce the possible space requirements or the possible surface area for the active regions. The construction space necessary for contacting thus considerably restricts the efficient further development of the devices.

When developing new generations of DMOS power transistors, an important goal is the reduction of the specific on-resistance $R_{on} \cdot A$, for example. A reduction of the specific on-resistance is desirable for the very reason alone that it may minimize the static power loss, on the one hand, and that higher current densities may be achieved, on the other hand, as a result of which smaller and cheaper chips may be employed for the same total current.

SUMMARY

In accordance with one embodiment, a connecting structure for an electronic device includes an edge region of the device, a first trench and a second trench running toward the edge region, a first electrode within the first trench, and a second electrode within the second trench, the first and second electrodes being arranged in a same electrode plane with regard to a main surface of a substrate of the electronic device within the trenches, the first electrode extending, at an edge region side end of the first trench, farther toward the edge region than the second electrode extends, at an edge region side end of the second trench, toward the edge region, and the first electrode being connected to a connection structure for a first potential, and the second electrode being connected to a connection structure for a second potential.

In accordance with a further embodiment, a connecting structure for an electronic device includes a first edge region, a second edge region opposite the first edge region, a central region arranged between the first edge region and the second edge region, first, second, and third trenches running toward the first edge region and the second edge region, and a first electrode within the first trench, a second electrode within the second trench, and a third electrode within the third trench in an electrode plane arranged with regard to a main surface of a substrate of the electronic device, the first electrode extending farther into the first edge region than the second and third electrodes, the third electrode extending farther into the second edge region than the first and second electrodes; the first and third electrodes not extending into the central region, the first electrode and the third electrode being arranged on a straight connecting line, the second electrode being arranged offset to the connecting line, and the first electrode and the third electrode being contacted with a connection structure for a first potential, and the second electrode being connected with a connection structure for a second potential.

In accordance with a further embodiment, a connecting structure for an electronic device includes an edge region of the device, a first trench and a second trench running toward the edge region, a first electrode within the first trench, no further electrode being arranged, to the side of the first electrode, within the first trench, a second electrode within the second trench, no further electrode being arranged, to the side of the second electrode, within the second trench, the first electrode, in an edge region side end of the first trench, extending farther toward the edge region than the second electrode at an edge region side end of the second trench extends towards the edge region, and the first electrode being connected to a connection structure for a first potential, and the second electrode being connected to a connection structure for a second potential.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 8 illustrates a further enlargement of a detail of the top view illustrated in FIG. 5.

DETAILED DESCRIPTION

Figure 1:
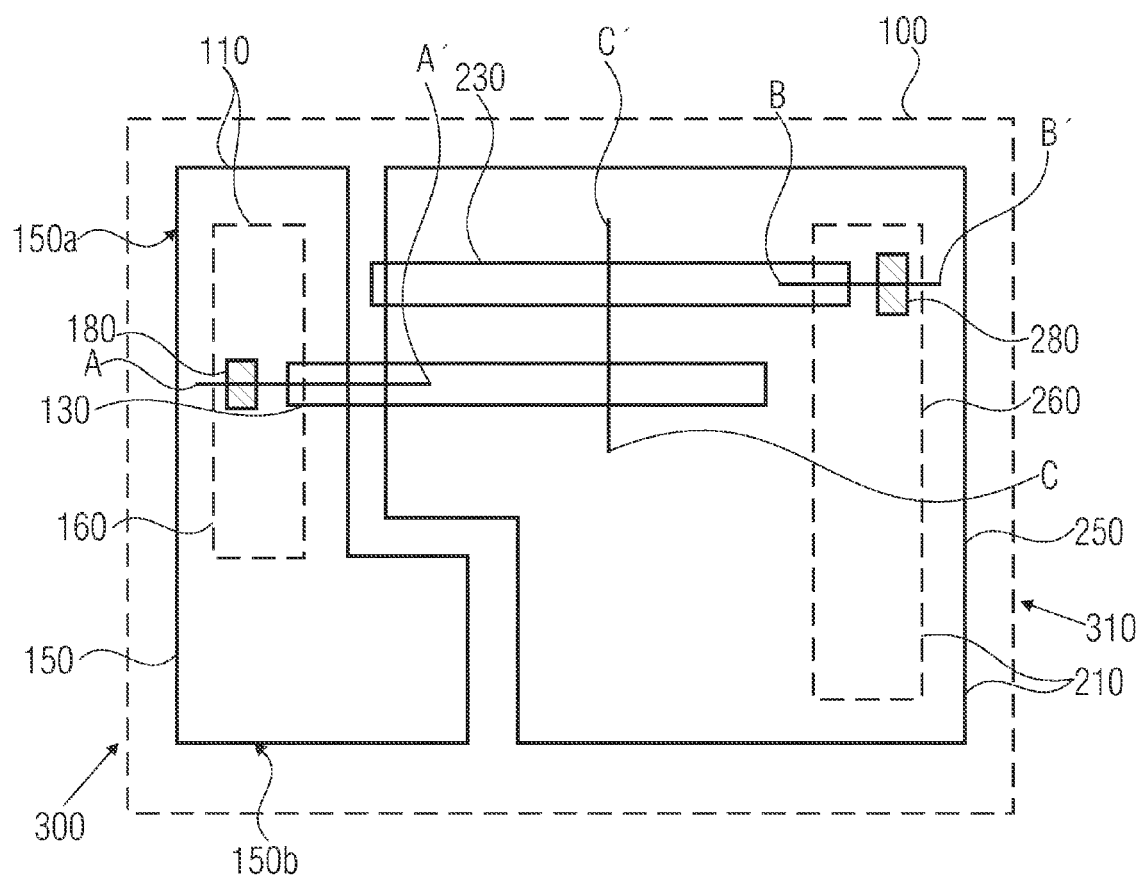
FIG. 1 illustrates a top view of an electronic device comprising an embodiment of an inventive connecting structure.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A first embodiment will be explained in more detail with reference to FIGS. 1 to 9b in the form of a connecting structure for an electronic device, and the electronic device itself will be explained below in more detail with reference to the representations depicted in FIGS. 1, 2a, 2b, and 2c.

To simplify the representation, a representation of those elements of the electronic device in question which are of secondary importance for the embodiments of the connecting structure concerned has been specifically dispensed with. For example, the partial cross-sectional drawings of FIGS. 2a, 2b, and 2c do not contain a representation of doping profiles or other structures not related to the actual connecting structure, so as to keep the representation simple and clear. If the electronic device, for which an embodiment of the connecting structure is illustrated, is a vertical transistor, for example, the associated doping will not be contained in the figures in the region between the trenches, the so-called mesas. If the electronic device is a capacitance, for example, an electric conductivity may be introduced, in the region of the mesas, by means of a specific implantation by means of donors or acceptors which belong to a doping of the region in question, so as to reduce, for example, a typical RC time of the resulting capacitor. This implantation is also not illustrated here.

In addition, the structures depicted in FIGS. 1, 2a, 2b, and 2c may be prepared, or manufactured, by common methods of semiconductor technology and thin-film technology. These include, among others, the deposition of epitactic layers by means of sputtering processes, CVD processes (chemical vapor deposition), or other physical and/or chemical deposition processes. The common semiconductor process steps and thin-film process steps further include the deposition of polycrystalline or amorphous semiconducting, insulating or metallic layers by means of sputtering processes, CVD processes, vaporization processes, or other chemical and/or physical deposition processes, by means of which polymorphous silicon layers (poly Si), for example, may be deposited. Examples of a deposition of silicon dioxide ($SiO_2$) by means of a CVD process are the so-called TEOS process (tetraethyl orthosilicates). Here, metal layers may include, for example, layers made of one or several alloys and/or metals.

The further thin-film and semiconductor process steps further include structuring steps by means of photolithography or other masks along with physical and/or chemical etching steps as well as process steps for removing the mask. The etching steps include, for example, the wet-chemical etching process, physical etching processes (IBE=ion beam etching) and physical/chemical etching processes (RIE=reactive ion beam etching). Specifically, IBE processes and RIE processes are also referred to as plasma etching processes. The common processes for removing a mask include, among others, wet-chemical processes, such as exposing the intermediate result to an acetone solution, or incineration by means of an oxygen plasma or a different plasma on the basis of a reactive gas or gas mixture.

Further common processes further include steps of oxidizing semiconducting or metal layers and structures, tempering steps or annealing steps by exposing the intermediate result to an increased temperature, possibly by exposure to a specific atmosphere, steps of implanting to achieve a doping, or a doping profile, diffusion steps, formation of further compounds (for example, titanium suicides), implantations for forming contact regions, depositing complex compounds (for example, AlSiCu), lift-off processes and further standard processes for processing a rear of the substrate of the (to-be) electronic device. Similarly, planarization steps and dicing steps for separating individual chips or dies from a wafer are also among the standard steps.

With regard to the structures depicted in FIGS. 1 to 9b, it may also be noted that these representations are not to scale. For example, the drawings allow no conclusions to be drawn in terms of vertical dimensions in relation to a main surface, or surface, of a substrate of the electronic device comprising the embodiments of the connecting structures, nor with regard to lateral dimensions of the respective structures conclusions in terms of concrete dimensionings of implementations of the embodiments. Rather, the reproduction ratios selected in the figures have been specified with a view to a clear representation and illustration of the embodiments. For example, the figures allow no conclusions to be drawn in terms of mutual thickness ratios of layers. Similarly, the figures allow no conclusions to be drawn in terms of characteristic lengths of lateral structures. For example, especially small structures, that is, structures typically ranging below 5 μm, are depicted in a clearly enlarged manner so as to describe the embodiments.

FIGS. 1, 2a, 2b, and 2c illustrate a first embodiment of a connecting structure for an electronic device 100. The electronic device 100 is formed on a substrate on a main surface, or surface. The electronic device 100 may both be integrated on a chip as an individual device after a dicing step, or may be integrated on the chip along with further electronic devices and/or other components.

In this context, FIG. 1 illustrates a top view of the main surface of the substrate of the electronic device 100 comprising a connecting structure 110 for a first electrode 120 (not illustrated in FIG. 1) which is arranged, within a first trench 130, below the connecting structure 110 in relation to the main surface of the substrate.

To enhance understanding of the vertical arrangement of the individual structures, the electric device depicted in FIG.

Figure 2A:
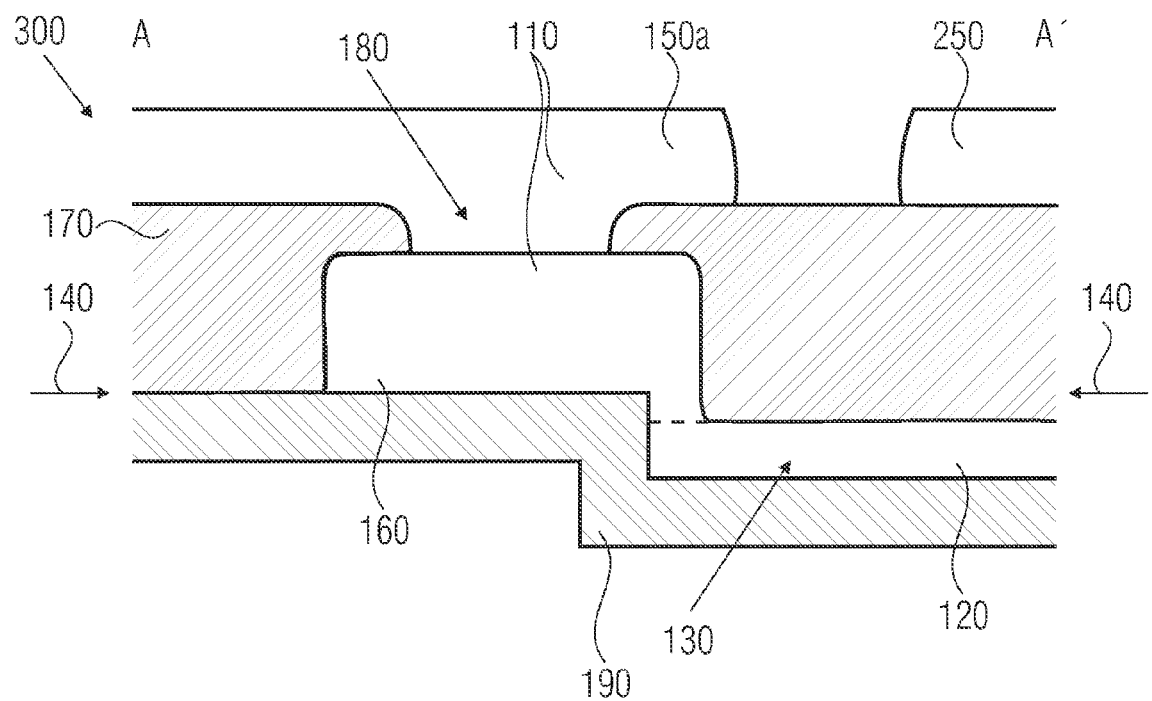
FIGS. 2a-2c illustrate three partial cross-sectional representations of the electronic device illustrated in FIG. 1.
Figure 2B:
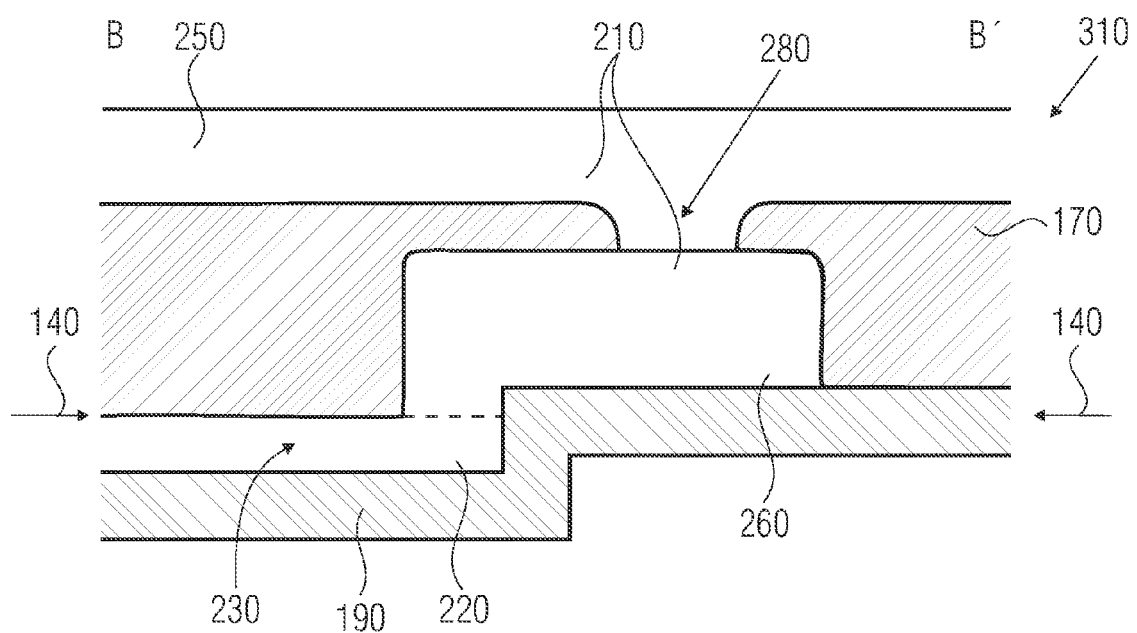
Figure 2C:
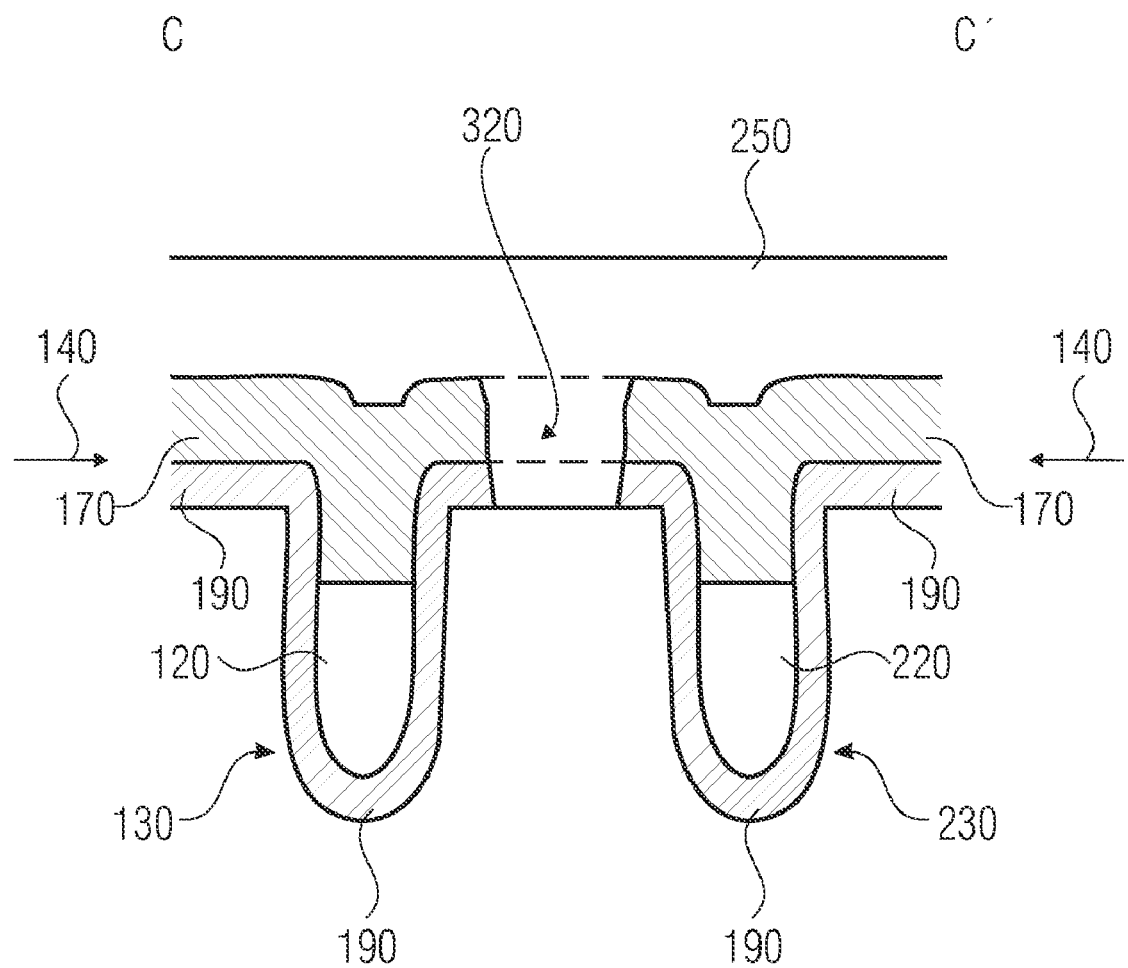

1 comprising the first embodiment of a connecting structure is also illustrated in parallel using FIGS. 2a, 2b, and 2c. Here, FIG. 2a illustrates a section A-A' through the device 100, said section being drawn in as a horizontal line. Accordingly, FIG. 2b illustrates a section through the device 100 along the line which is designated by the straight line B-B' in FIG. 1, while FIG. 2c illustrates a section along the line designated as line C-C' in FIG. 1. Here, the markings 140 (arrow) illustrate the surface, or main surface, of the substrate of the electronic device 100.

As was already mentioned above, the connecting structure 110 for the first electrode 120 is arranged above the first electrode 120 in relation to the main surface of the substrate, and includes a metal structure 150 which includes, in the embodiment of a connecting structure which is illustrated in FIG. 1, a metallic conductor line 150a and a contacting area, or a bondpad 150b. The metallic conductor line here typically has a width, that is, an expansion along the line defined by the straight line A-A', of typically between 10 μm and 100 μm, whereas the bondpad 150b is typically configured to be rectangular or square, the two side lengths each ranging between 200 μm and 500 μm. The bondpad 150b is frequently configured to be square and to have an edge length of about 300 μm.

The connecting structure, or connection structure, 110 further includes a lower-lying contact structure 160 which is arranged below the metal structure 150 in relation to the surface of the substrate, and is typically prepared from polymorphous silicon (poly Si), which may possibly be configured as doped or highly doped polysilicon in order to adapt an electrical resistance of the lower-lying contact structure 160. Alternatively, the contact structure which is arranged lower down may also be produced from a metal, for example aluminum (Al), tungsten (W), copper (Cu), gold (Au), silver (Ag), titanium (Ti), or an alloy. The lower-lying contact structure 160 here is in direct contact with the first electrode 120 within the first trench 130.

In the embodiment of a connecting structure for an electronic device 100, said embodiment being illustrated in FIGS. 1, 2a, 2b, and 2c, the electronic device 100 further includes an insulating layer 170 which enables, on the one hand, electrical insulation of the first electrode 120 from the layers arranged above it. On the other hand, it further serves to planarize, or level, the electronic device prior to depositing the metal structure 150 having the metallic conductor line 150a and the bondpad 150b. As is also illustrated in FIGS. 2a, 2b, and 2c, the insulating layer 170 here also covers the lower-lying contact structure 160 at the side facing the metal structure 150. In order to nevertheless enable an electrically conductive contact between the metal structure 150 and the lower-lying contact structure 160, a contact hole 180 has been formed in the insulating layer 170. Depending on the specific implementation of the electronic device and of the embodiment of the connecting structure, it may be advisable to additionally introduce a further metallic or semiconducting, essential vertically running connection structure in the region between the metal structure 150 and the lower-lying contact structure 160. Depending on the specific implementation, the latter is also referred to as a W plug or as a poly plug, or Si plug, should the connection structure in question be made of tungsten (W) or (doped or highly doped) polysilicon. In the context of the present application, essentially vertically running structures and objects are to mean such structures and objects which form, in a normal of the surface of the substrate, an angle of typically less than 20°, and less than 5°.

As is also illustrated in FIG. 2a, a further insulating layer 190, which electrically insulates the respective structures from the underlying structures, is arranged below the first electrode and below the lower-lying contact structure, which is typically also referred to as poly because of the utilization of polymorphous silicon. Both the insulating layer 170 and the insulating layer 190 may be configured, for example, as oxide layers, nitride layers, or other electrically insulating layers which undermine a parasitic, or undesired, vertical transport of current to the surface of the substrate between the individual layers and structures. For this reason, the insulating layers 170 and 190 are frequently also referred to as oxide, or oxide layer.

The embodiment, depicted in FIGS. 1 to 2c, of a connecting structure for the electronic device 100 further includes a connecting structure 210 for a second electrode 220 (not illustrated in FIG. 1) within a second trench 230. Like the connecting structure 110 for the first electrode 120, the connecting structure 210 for the second electrode 220 also includes a metal structure 250 and a lower-lying contact structure 260. Like the connecting structure 110, the connecting structure 210 may be made of a metal such as aluminum, copper, titanium, tungsten, gold, or silver. In addition, like the connecting structure 110, it may also include any alloy having a specific electric resistance adapted to the purpose of utilization.

The lower-lying contact structure 260 for the second electrode 220 may be made of a metal, an alloy, and a semiconductor material, for example polymorphous, or polycrystalline, silicon (poly Si). However, unlike the metal structure 150, the metal structure 250 for the second electrode 220 is typically dimensioned such that in wide areas of the electronic device 100, its surface area exceeds the minimum size necessary for contacting. More specifically, in the electronic device, depicted in FIGS. 1 to 2c, comprising the first embodiment of a connecting structure, the metal structure 250 is deposited on a large part of the area of the device 100, so that the electrical contacting of the second electrode with an exterior circuit may be performed, for example, by means of a bonding process in a large area of the surface of the electric device.

Similar to the first electrode 120 within the first trench 130, the second electrode 220 within the second trench 230 is directly connected, via the lower-lying metal structure 260, in an electrically conductive manner to a region arranged outside the second trench 23. In other words, the two electrodes 120, 220 are routed out of the trenches 130, 230 through the two lower-lying contact structures 160, 260.

Just like FIG. 2a has illustrated this for the lower-lying contact structure 160 of the first electrode, the lower-lying contact structure 260 for the second electrode 220 is covered, as is illustrated in FIG. 2b, by the insulating layer 170, except for a contact hole 280, via which—possibly via a contact structure which runs in an essentially vertical manner (for example, W plug or Si plug)—the lower-lying contact structure 260 is in electrical contact with the metal structure 250. In this manner, the second electrode 220 may be electrically contacted via the metal structure 250, which also serves as a bondpad, via the lower-lying contact structure 260.

Accordingly, the first electrode 120 may also be connected to an exterior circuit via the bondpad 150b of the metal structure 150 and the metallic conductor line 150a and the lower-lying contact structure 160. Here, both the metal structure 250 and the bondpad 150b are typically electrically coupled, or connected, to a housing via bondwires which are deposited during a bonding process.

As is illustrated in FIG. 1, the first trench 130 is aligned essentially in parallel with the first electrode 120, and the second trench 230 is aligned essentially in parallel with the second electrode 220, or they extend essentially in parallel.

For the purposes of the present application, trenches and/or electrodes which run or extend essentially in parallel are to mean those which typically form an angle of less than 20° and less than 5° with each other.

Here, the first electrode 120 and the second electrode 220 extend toward an edge region 300 of the device 100, the first electrode 120 extending farther, on the side of the edge region, within the first trench 130 than the second electrode 220 within the second trench 230. Typically, the first electrode extends at least 10 µm farther toward the edge region 300 than does the first electrode 220. Depending on the respective implementation of the electronic device 100, the first electrode 120 extends by more than 50 µm or by more than 100 µm farther toward the edge region 300 than does the second electrode 220.

In addition, the device 100 additionally includes a further edge region 310 which is opposite the edge region 300. As is also illustrated in FIG. 1, the second electrode 220 here extends farther toward the further edge region than does the second electrode 120. Typically, the second electrode 220 extends by at least 10 µm farther toward the further edge region 310 than does the first electrode 120. However, depending on the respective implementation, or dimensioning, of the device 100, the second electrode 220 may also extend by at least 50 µm or by at least 100 µm farther toward the farther edge region 310 than does the first electrode 120.

FIG. 2c illustrates a partial cross-sectional representation of the device 100 along the line designated as C-C' in FIG. 1 and running through the device 100. Here, the first electrode 120 and the second electrode 220 are arranged in an electrode plane with regard to the main surface, or surface, indicated by the marking 140, of the substrate.

For the purposes of the present application, two electrodes belonging to the same electrode plane are to mean such electrodes which, with regard to the cross-section which is perpendicular to an extension direction of the trenches 130, 230, are given identical or similar geometrical shapes within the trenches, and/or which are prepared during the same manufacturing step(s). This may mean, for example, that the two electrodes in question have identical or comparable upper edges and lower edges in relation to the main surface of the substrate. For the purposes of the present application, identical or comparable upper edges, identical or comparable lower edges, and identical or comparable geometrical shapes are to mean those which differ from one another by typically less than +/−30%, and by less than +/−20%.

Depending on the specific implementation of the device 100, it may, in addition, be advisable or necessary to electrically couple the mesa region between the two trenches 130, 230 to the metal structure 250. Examples of this are, among others, vertical transistors as will be described in more detail below in the present application. For this purpose, the insulating layer 170 and the further insulating layer 190 may be connected, in the region between the two trenches 130, 230, to the metal structure 250 through one or several further contact holes 320. Depending on the specific implementation of the device 100 and the methods used for manufacturing, it may be advisable in this context to provide separate contact holes or contact trenches 320 for the two insulating layers 170, 190, which contact holes or contact trenches, in turn, are contacted with the metal structure 250 via, for example, a W plug or an Si plug, depending on the specific implementation of the device 100.

Similar to the further embodiments, the above-described embodiment is based on the findings that, based on an overall surface area of the device 100, an increased integration may be achieved in that two different electrodes 120, 220, which are arranged in the same electrode plane with regard to the main surface of the substrate of the electronic device 100, extend over different distances toward the edge-region side end of the trench wherein they are arranged. In this manner, a substantial proportion of the overall surface area of the device may be utilized for active, semiconducting structures, the so-called cell field, without these areas being lost for the contacting of the cell field due to necessary metallic conductor lines.

Thus, with the embodiment described, as with the further embodiments, in relation to the overall surface area of the device 100, the integration density may be increased in that the cell field is enlarged, and the space on the substrate which is necessary for the connecting structures is restricted. In other words, the embodiments enable reduced space requirements for the connecting structures 110, 210, and thus, with a given overall surface area, an increase in the space for the active components of the electronic device 100, or the cell field.

As further embodiments will illustrate, the embodiments of the connecting structure for an electronic device 100 additionally enable the use of several, electrodes, arranged one above the other, within the trenches. Thus, embodiments enable contacting even so-called high-speed dense trench transistors having an extremely low on-resistance in a very space-saving manner. Thus, so-called "dual-poly transistors" comprising more than one superimposed electrode within a trench may be connected in the case of the high-speed dense trench transistors.

The embodiment described in the context of FIGS. 1 to 2c, of a connecting structure for an electronic device may thus be employed, for example, for the purposes of DMOS power transistors, wherein an important goal is the reduction of the specific on-resistance $R_{on} \cdot A$. In this manner, the static power loss may be minimized, on the one hand, on the other hand, higher current densities may be achieved, as a result of which smaller and cheaper chips may be used for the same total current.

In addition, however, it is also necessary, for fast switching, to have as small a gate charge as possible, for example, with regard to a capacitance between gate and drain. It is true that this frequently results in opposite trends, since measures for reducing the specific on-resistance $R_{on} \cdot A$ will often lead to an increase in the gate charge. However, the embodiments of the connecting structures described within the context of the present application specifically represent a contribution to a further reduction of the specific on-resistance and to the implementation of so-called fast-switching dense trench transistors (vertical transistors including densely arranged trenches) having an extremely low on-resistance $R_{on} \cdot A$.

A possible solution with regard to reducing the specific on-resistance is to deviate from the planar cell structure, and to use cells comprising trenches, so-called trench cells, as is also illustrated in FIGS. 1 to 2c. In this manner, the channel resistance is reduced by a clear increase in the channel width per area. In this case, the metal structure 250 represents a terminal for a source potential of the electronic device 100 in the form of the trench transistor, which further includes a drain terminal implemented on a rear of the substrate, that is, on the surface which is opposite the surface, or main surface, of the substrate.

In this manner, an electric resistance between the source terminal and the drain terminal of the trench transistor is determined to a substantial degree by the electric resistance of the so-called drift path (epi resistance), which may be achieved by using deep trenches. A further reduction of the drift path resistance may be further reduced, for example, in the entire region of the so-called epi zone, that is, a region of the trench transistor which was created by epitaxial growth, in that a growing doping is implemented in the entire epi zone.

In addition, the specific on-resistance may be optimized, in the direction of a low $R_{on} \cdot A$ value, in that so-called dense trench transistors are used wherein the trenches are arranged, or packed, so densely that a location where an avalanche breakdown occurs (avalanche breakdown location) is shifted, or transferred, to a region of the bottom of the trench.

With regard to a faster switching behavior, a so-called high-speed variant of a dense trench transistor may be employed wherein the fast switching is achieved merely in that every other trench, or trench strip, is completely applied to the source potential and is thus switched to be inactive. It is true that this leads to a degradation of the specific on-resistance $R_{on} \cdot A$ by about 25-30%, but at the same time it reduces the gate capacitance and therefore the gate charge by 50%, so that the characteristic parameter which is important for fast-switching transistors (FOM=figure of merit), $$FOM = R_{on} \cdot A Q_{Gate}/A,$$

is reduced overall, that is, in total, by about 10-20 percent, A being the surface area of the device, $Q_{Gate}$ being the charge of the gate electrode, and $R_{on}$ being the specific on-resistance.

Thus, if the electronic device 100 of FIGS. 1 to 2c is a respective dense trench transistor, the drain terminal will be localized at the rear of the substrate, while the metal structure 250 represents a terminal for the source potential as a second potential, and the metal structure 150 represents a gate terminal for the gate potential as a first potential. In this case, the first electrode 120 is the gate electrode, whereas the second electrode 220 is that electrode arranged within the trench which is switched to be inactive, or switched to source potential.

It is useful to note at this point that in the case of transistors, the structure of the further insulating layer 190 inside the trench may be implemented to be more complex than is illustrated in FIG. 2c. For example, the further insulating layer 190 may include different thicknesses and/or several layers.

To simplify reference, identical reference numerals will be used, in the following part of the present application, for object, functional units, and structures comprising identical or similar functional properties. In addition, summarizing reference numerals shall be used, in the following part of the present application, for objects which are included repeatedly in one embodiment, unless a single, specific object is to be referred to. For example, reference numeral 120 shall, on principle, refer to electrodes of the type of the first electrode in the following part of the present application.

It is useful in this context to point out that, unless explicitly indicated otherwise, on the one hand, portions relating to objects and structures having similar or identical functional properties, and/or to objects having summarizing reference numerals, are exchangeable among the descriptions of the various embodiments. On the other hand, it shall be noted that a shared use of a summarizing reference numeral or of a reference numeral for an object occurring in more than one embodiment shall not imply that these objects include identical features and properties in the various embodiments or in the embodiment in question, unless explicitly indicated. Utilization of shared or similar reference numerals shall thus not imply a statement with regard to the specific implementation dimensioning.

Figure 3:
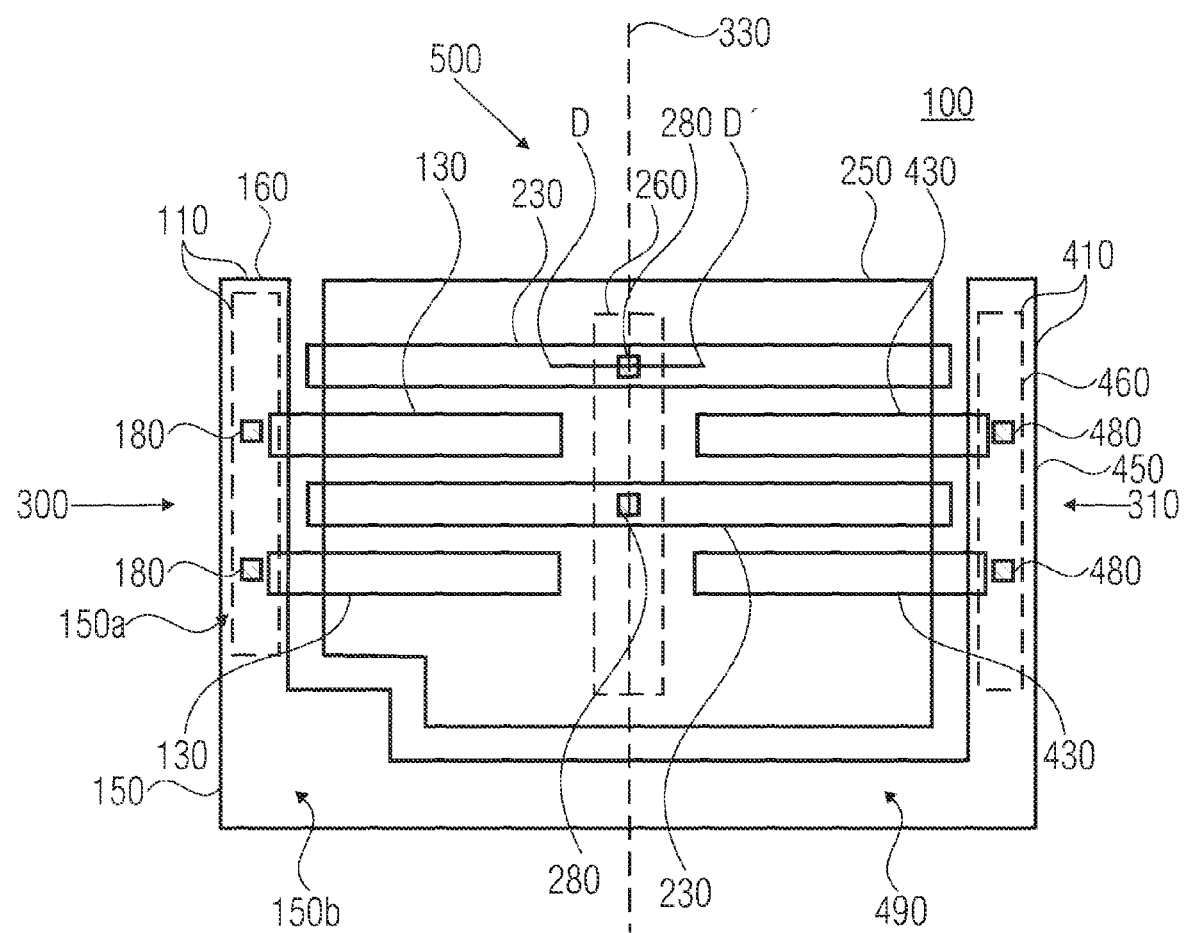
FIG. 3 illustrates a top view of an electronic device comprising a second embodiment of a connecting structure.
Figure 4:
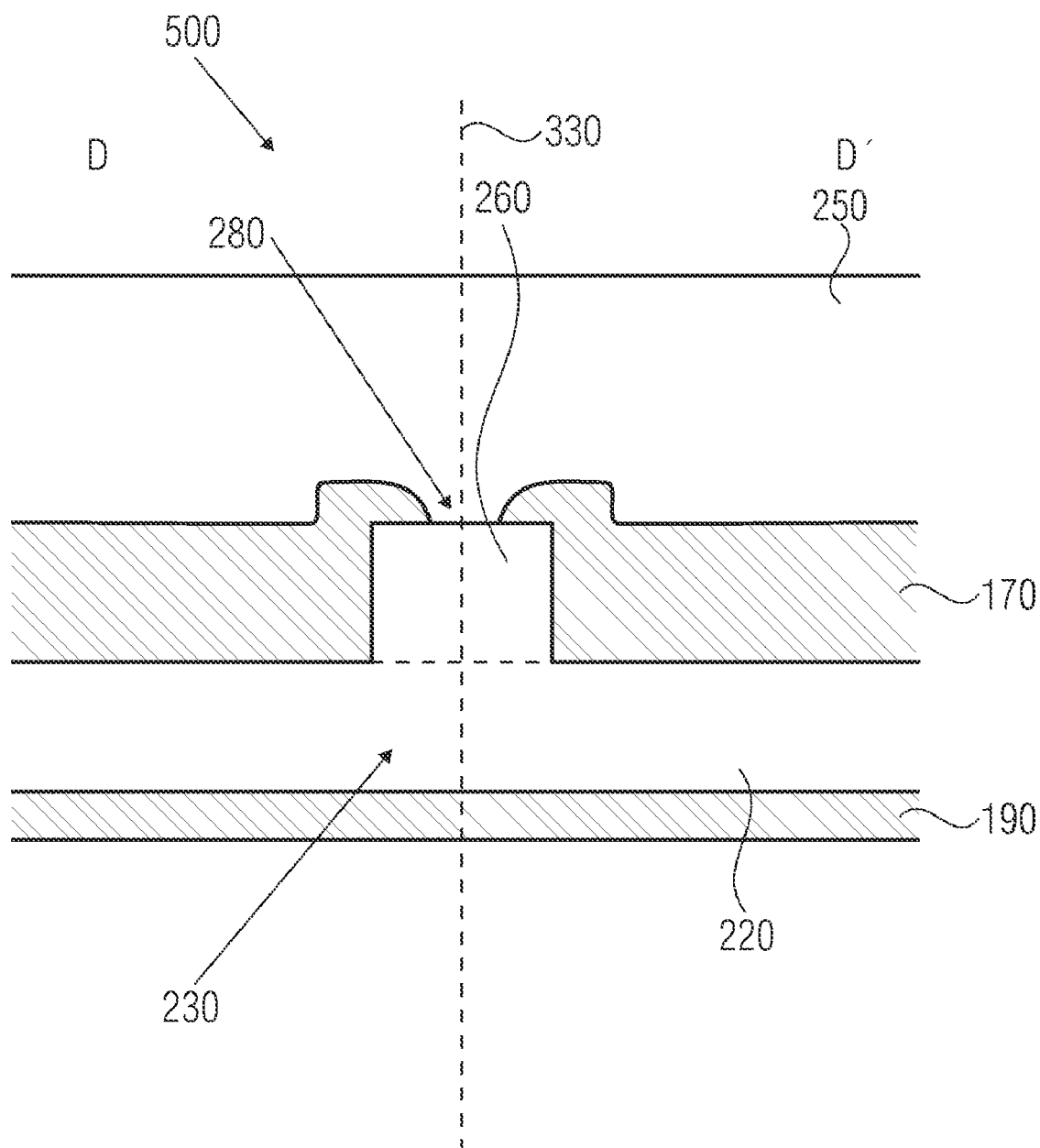
FIG. 4 illustrates a partial cross-sectional representation of the electronic device illustrated in FIG. 3.

FIGS. 3 and 4 illustrate a further embodiment of a connecting structure for an electronic device 100 which again may be, for example, a high-speed variant of a dense trench transistor.

It is only with regard to two aspects that the further embodiment, depicted in FIGS. 3 and 4, of a connecting structure for an electronic device 100 differs from the embodiments illustrated in FIGS. 1 to 2c and from the electronic device 100 depicted there:

1. Unlike the electronic device 100 illustrated in FIG. 1, the electronic device illustrated in FIG. 3 does not include an individual first trench 130 comprising the associated first electrode 120, but includes a plurality of first trenches 130 comprising associated first electrodes 120 (not illustrated in FIG. 3) arranged within the first trench 130. Likewise, the electronic device 100 illustrated in FIG. 3 further includes a plurality of second trenches 230 comprising associated second electrodes 220 (not illustrated in FIG. 3).

2. In addition, the device illustrated in FIG. 3 includes a symmetrical continuation, or mirroring, of the electronic device 100 illustrated in FIG. 1 with regard to a mirror axis extending within the region of the further edge region 310 and extending perpendicularly to the direction of extension of the trenches 130, 230 through the contact hole 280. In FIG. 3, the respective symmetry axis is drawn in as a dotted line 330.

Because of the "mirroring" of the device 100, several changes occur with regard to the embodiment of the connecting structure which shall be briefly explained below. Due to the "mirroring", the electronic device 100 illustrated in FIG. 3 additionally includes a plurality of third electrodes 420 (not illustrated in FIG. 3), each arranged within a third trench 430 and also arranged in the same electrode plane with regard to the first electrodes 120 and the second electrodes 220.

For electrically contacting the third electrode 420, the device 100 illustrated in FIG. 3 further includes a connecting structure 410 for the third electrodes 420 which, again, includes a lower-lying contact structure 460 and a metal structure 450 in the form of a metallic conductor line, that is, comparable to the metallic conductor line 150a. About an electrical contacting of the third trenches 430 via the deep contact structure 460, which corresponds to the deep contact structures 160, 260 with regard to the choice of material and composition, contact holes 480 are again formed in the insulating layer 170, via which—possibly using a W plug or a poly plug—electrical contacting of the deep contact structure 460 with the metal structure 450 is enabled. With regard to material composition and dimensioning, the metal structure 450 essentially corresponds to the metal structure 150, or, more specifically, to the metallic conductor line 150a. The electrodes 120, 220, 420 are thus connected to, or contacted with, the connecting structures, or the connection structures 110, 210, 410.

The symmetry of the device 100 is interrupted only with regard to the terminal of the metal structure 450. For example, the device 100 further includes a metallic conductor line 490 which connects the metal structure 450 to the bondpad 150b in an electrically conductive manner. With regard to the material composition and dimensioning, the metallic conductor line 490 may be similar to the metallic conductor line 150a and/or the metal structure 450, or may match same.

Due to the "mirroring", further minor differences result with regard to the course and the extension of the electrodes 120, 220, 420 and of the trenches 130, 230, 430. Unlike the embodiment depicted in FIG. 1, in the embodiment illustrated in FIG. 3, the second electrodes 220 now extend considerably farther, with regard to the further edge region 310, or the second edge region, than the first electrodes 120 in the embodiment illustrated in FIG. 1. While in FIG. 1, the difference is typically at least 10 µm, in the embodiment illustrated in FIG. 3 it typically amounts, in the case of the symmetric layout, to about half the length of the entire device along the direction of extension of the trenches. If the dimensions of a device 100 typically range between 1 and 2 mm, the difference of the extension of the second electrode with regard to the further edge region 310 thus will range, compared to the first electrode 120, from about 500 μm to 1000 μm.

Here, the first trenches 130 and the third trenches 430, and/or the first electrodes 120 and the fourth electrodes 420, essentially run on a straight connecting line, whereas the second electrodes 220 and/or the second trenches 230 run so that they are offset in parallel as compared to the connecting lines of the first and third electrodes, or trenches.

By contrast, the third electrodes 420 extend at least by 10 μm farther with regard to the further edge region 310 as compared to the second electrodes 220, typically—depending on the layout of the device 100—by 50 μm or at least by 100 μm farther.

The embodiment illustrated in FIG. 3 of a connecting structure additionally includes a central region 500, into which the first electrodes 120 and the third electrodes 420 do not extend.

FIG. 4 illustrates a cross-section along the line D-D' illustrated in FIG. 3. Essentially, the cross-section D-D' differs from the cross-section B-B' depicted in FIG. 2b only in that, on the one hand, a symmetrical position with regard to the symmetry line 330 results in FIG. 4 because of the "mirroring" of the device, and in that, unlike section B-B' of FIG. 2b, the trench 230 is not interrupted.

FIGS. 5, 6, 7a, 7b, 7c, 8, 9a and 9b depict a further electronic device 100 in the form of a dense trench transistor as a high-speed variant, which is a so-called dual-poly variant, wherein two electrodes are arranged one above the other in two different electrode planes within the trenches, of which electrodes the lower one, respectively, is basically applied to source potential, and wherein in operation the electrodes which are arranged above the lower electrodes, respectively, are alternately applied to gate potential and source potential.

Figure 5:
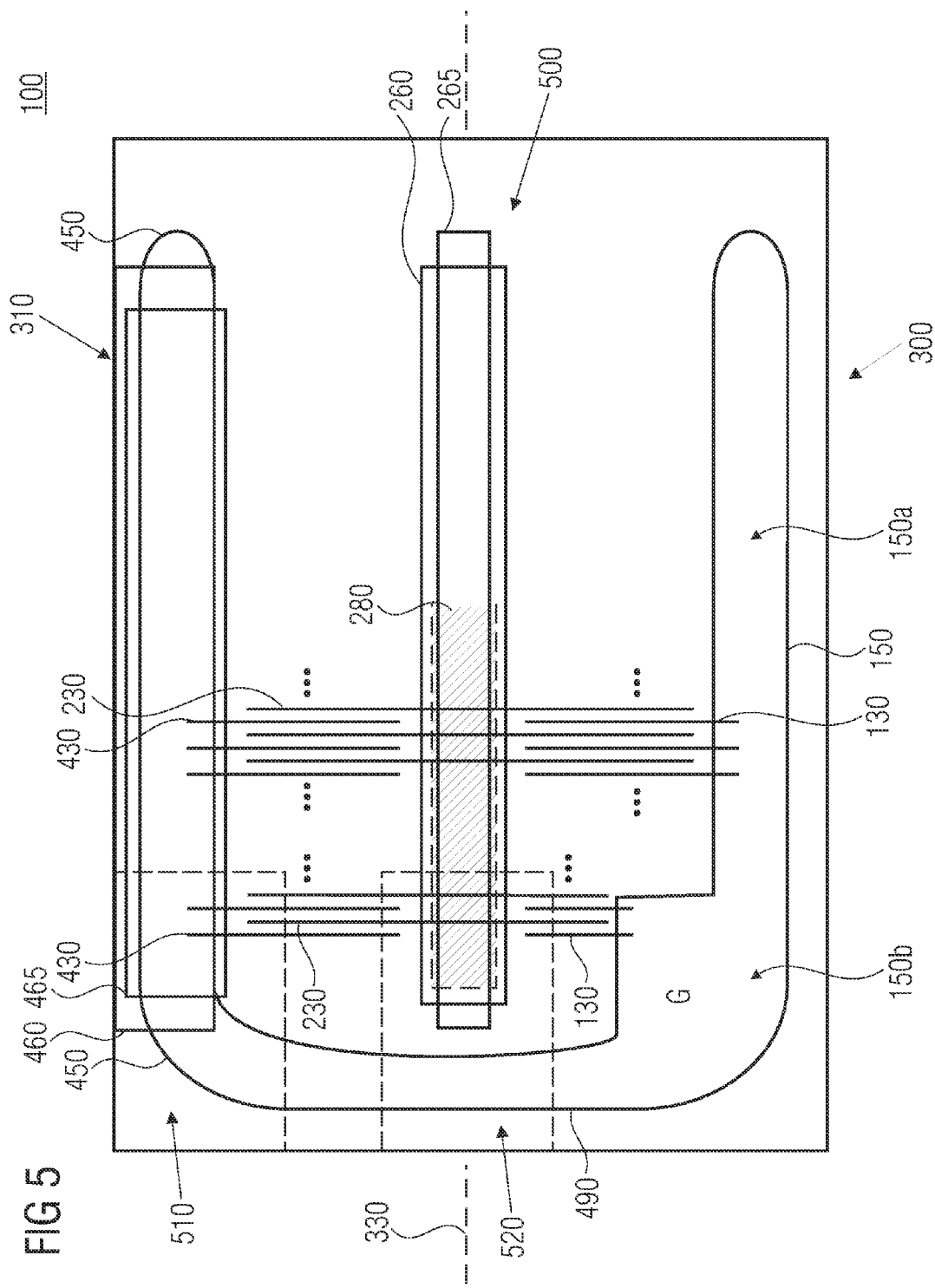
FIG. 5 illustrates a top view of a further electronic device comprising a third embodiment of a connecting structure.

FIG. 5 illustrates a highly simplified plan view of an electronic device 100 in the form of a high-speed variant of a trench transistor, for example a dense trench transistor. With regard to the architecture, the trench transistor described in FIGS. 5 to 9b is similar to the electronic device 100, described in connection with FIGS. 3 and 4, with regard to the embodiment of the connecting structure. For example, this trench transistor 100, too, includes a metal structure 150 having a metallic conductor line 150a, a bondpad 150b to which the gate potential of the trench transistor (first potential) may be fed via bondwires, for example. Just as with the device 100 depicted in FIG. 3, the bondpad 150b here also has a metallic conductor line 490 connected to it which leads into the metal structure 450 for the third electrodes 430 (not illustrated in FIG. 5).

Unlike the device 100 illustrated in FIGS. 3 and 4, in this embodiment a connecting structure includes the electronic device 100 in the form of a trench transistor comprising a plurality of first, second and third electrodes 120, 220, 420 within respective first, second and third trenches 130, 230, 430, a first trench 130 and a third trench 430, or a first electrode 120 and a third electrode 420, being again arranged on a connecting line extending in a straight manner. The second electrodes 220, or the second trenches 230, are arranged such that they are offset thereto in a parallel manner, the first electrodes 120 and the third electrodes 420, again, not extending into the central region 500. Accordingly, the second electrodes 220 extend less far into the edge region 300 than the first electrodes 120, and, with regard to the further edge region 310, less far than the third electrodes 420 (or the respective trenches 130, 230, 430).

However, the embodiment of a connecting structure which is described in FIGS. 5 to 9b differs from the above-described devices in two essential points. On the one hand, the contact hole 280 in the central region is implemented as a continuous contact hole, or as a continuous contact opening. In addition, the trenches 130, 230, 430 have two electrodes arranged therein, respectively, which are arranged one above the other. More specifically, with regard to the main surface of the substrate, a first lower electrode 120u is arranged below the first electrode 120, a second lower electrode 220u is arranged below the second electrode 220, and a third lower electrode 420u is arranged below the third electrode 420. Details on this will be more fully described with regard to FIG. 7c.

Here, the respective lower electrodes 120u, 220u, 420u are applied to source potential during the operation of the transistor. For contacting the respective lower electrodes 120u, 220u, 420u, the embodiment described in FIGS. 5 to 9b further includes a lower-lying contact structure 265, 465, referred to as poly S, respectively, which will be explained in more detail below with reference to FIGS. 6 to 9b. Also, the device further includes a lower-lying contact structure which is referred to as poly S 165 and arranged in the region of the metal structure 150, but is not illustrated in FIG. 5 so as to simplify the representation.

As was already described in the context of the preceding embodiments, the lower-lying contact structures 160 (not illustrated in FIG. 5), 260 and 460 serve for contacting the first, second and third electrodes 120, 220, 420, which, in the event of the non-high-speed variant of a trench transistor, are applied to gate potential during the operation of the transistor, and are therefore referred to as poly G 160, 260, 460 because of their implementation on the basis of polymorphous silicon (poly Si). In the high-speed variant illustrated in FIGS. 5 to 9b, the second electrodes 220, which otherwise serve as gate electrodes, are also applied to source potential during operation. Here, the electrodes 220 which are applied to source potential form a regular arrangement in relation to the electrodes 120, 420 which are applied to gate potential.

In the electronic device 100 depicted in FIGS. 5 to 9b, every other electrode, which actually acts as a gate electrode, is electrically coupled to the terminal for the source potential. More specifically, the first electrodes 120 and the third electrodes 420 are connected to the gate potential via the respective connecting structures during operation, whereas the second electrodes 220 are connected to the terminal for the source potential, so that they are also applied to source potential during operation. Irrespective thereof, however, it is even in the case of the high-speed variant that the respective lower-lying contact structures for the second electrodes 220, which are applied to source potential during operation, are referred to as "poly G".

In addition, the metallic conductor line 150a forms, along with the metallic conductor line 490 and the metal structure 450, the so-called gate runner, which enables, as a U-shaped metallic structure, the connection of the first electrode 120 and of the third electrode 420 within the first trench 130 and the third trench 430. For contacting at an external circuit or the housing of the electric device 100, the gate runner thus typically also includes a bondpad 150b.

The embodiment of a connecting structure which is illustrated in FIGS. 5 to 9b thus enables, in the case of trench transistors having several poly electrodes 120, 220, 420, 120u, 220u, 420u, the terminals to be implemented for those polyelectrodes which are applied to source potential in operation and are located within the trench 130, 230, 430, respectively, by means of a so-called source finger structure below the metal structure, or source cell field metallization 250, not illustrated in FIG. 5. As a further simplification, there is the possibility—in the case of the high-speed variant illustrated in FIGS. 5 to 9b—of routing through only those trenches 230 below the source finger structure, and to contact them with the source finger structure, which are to be fully applied to source potential during operation and thus are inactive in terms of a current between the source contact and the drain contact (forward current). Here, the source finger structure includes, the lower-lying contact structures poly G 260 and poly S 265, arranged in the central region 500 of the electronic device, along with the associated structures.

Compared to a known solution having two interlocking metallization runners, more specifically a gate runner, which is also depicted in FIG. 5, and an additional so-called source metal ring, the principle of using the source finger structure enables, within the context of embodiments of a connecting structure, a significant saving in terms of the space necessary for contacting. Compared to a classical structure in accordance with a possible solution laid out above which connects the two poly S—which are successively routed out of the trench at the chip edge—in the chip edge region, and therefore leads to a considerable space requirement in chip edge design, one embodiment of a connecting structure enables considerable space saving.

The structure illustrated in FIG. 5, for example, of an embodiment of a connecting structure thus enables the contacting of the source electrodes (second electrode 220, second lower electrode 220u) within the trench 230 in the center of the chip (central region 500) by means of the source finger structure below the source metal of the metal structure 250. Due to the introduction of the source finger structure, the large space requirement at the chip edge, which is due to the typical rules for laying out a design having a sufficiently high yield (metal design rules), is reduced. For example, the embodiments of a connecting structure as is illustrated, for example, in FIGS. 5 to 9b enable, that only the gate electrodes (first electrode 120, third electrode 420) within the trenches 130, 430 are now connected at the chip edge.

FIG. 5 illustrates an overview of a chip having the described high-speed variant, wherein only the gate runner is routed at the chip edge region, whereas the source finger structure described is arranged in the center of the chip (central region 500). In other words, FIG. 5 illustrates that regular trenches, or their electrodes 120, 420, which are to be applied to gate potential during operation, are connected from the chip edge via the gate runner described. As will also be illustrated by FIGS. 6 to 9b, it is there that classically the poly G 460 or the gate poly is contacted with the gate runner, so that same may be applied to gate potential during operation. The poly S 165, 465, or the source poly is connected to the metal structure 250 in the process, so that it may be applied to source potential during operation. The trenches which are fully applied to source potential during operation, or their electrodes (second electrode 220 and second lower electrode 220u) are cut off from chip-edge contacting by their smaller extension with regard to the edge region 300. Likewise, the second electrode 220 and the second lower electrode 220u are cut off, due to their smaller extension with regard to the further edge region 310, also with regard to the connecting structure 410 for the electrodes 420, 420u of the third trenches 430. To make up for this, however, they are fully routed through below the source finger construction in the center of the chip, that is, in the central region 500, and are contacted there, whereas the electrodes 120, 120u, 420, 420u of the first trenches 130 and of the third trenches 430 do not extend into the central region 500.

In the center of the chip, that is, in the region of the central region 500, the two polys, the poly G 260 and the poly S 265, are connected to the metal structure 250, so that they may be applied to source potential during operation. For example, the poly G 260—which in the "regular case", that is, in the case of a transistor which is not implemented as a high-speed variant would be contacted with the terminal for the gate potential—is connected to the metal structure 250, that is, to the terminal for the source potential.

Below, the structure, depicted by the rough overview in FIG. 5, of the electronic device and of the embodiment of the connecting structure shall be explained in more detail. For this purpose, a first region 510 in the region of a corner of the electronic device 100 shall be initially described in more detail in connection with FIGS. 6, 7a, 7b, and 7c, whereafter a second region 520 in the region of the center of the device 100 shall be described in connection with FIGS. 8, 9a and 9b.

Figure 6:
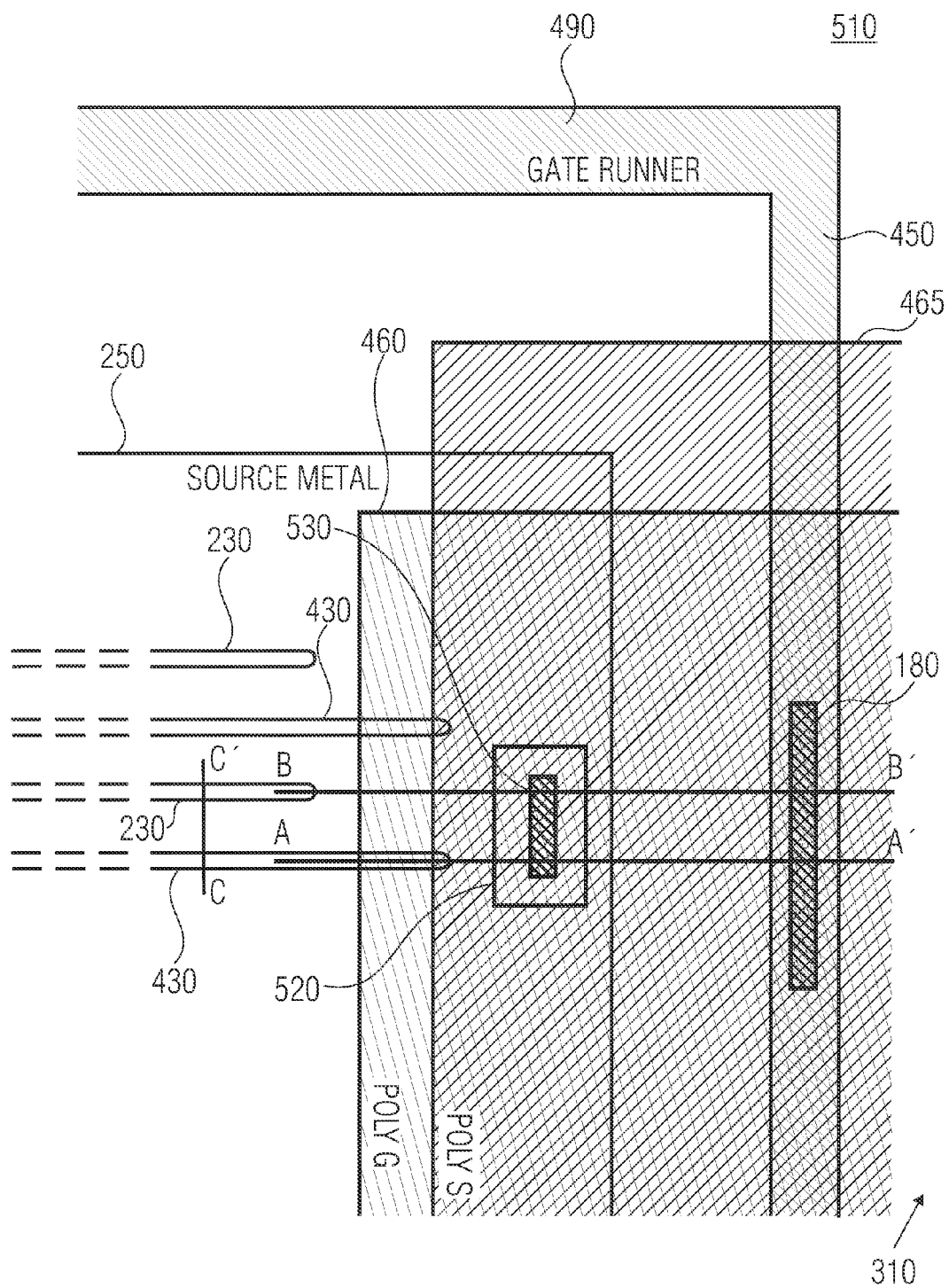
FIG. 6 illustrates an enlargement of a detail of the top view illustrated in FIG. 5.
Figure 7A:
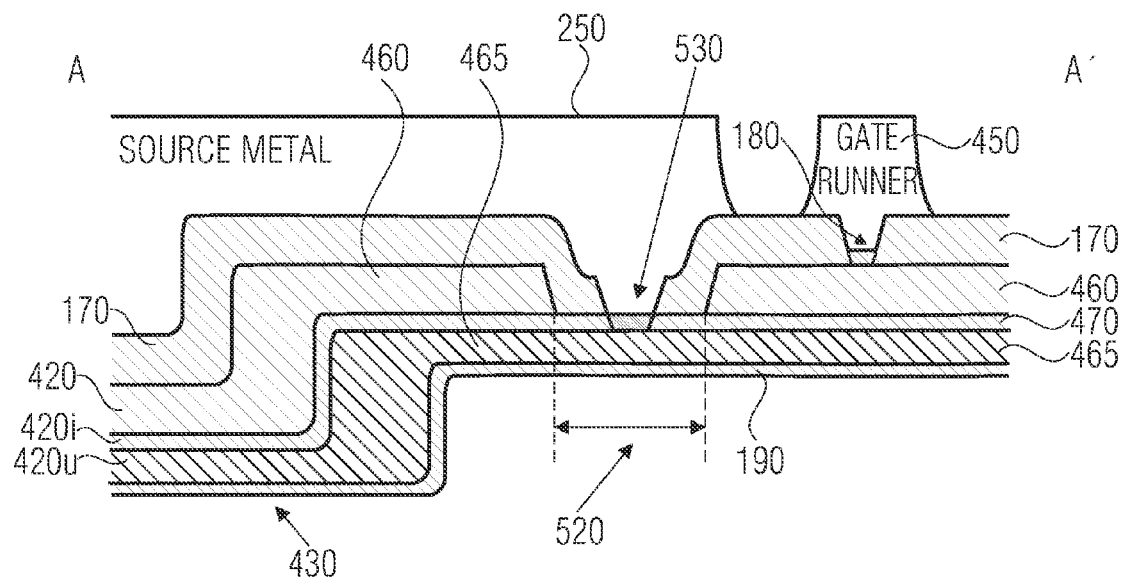
FIGS. 7a-7c illustrate three partial cross-sectional representations of the electronic device of FIG. 5 in the detail illustrated in FIG. 6.
Figure 7B:
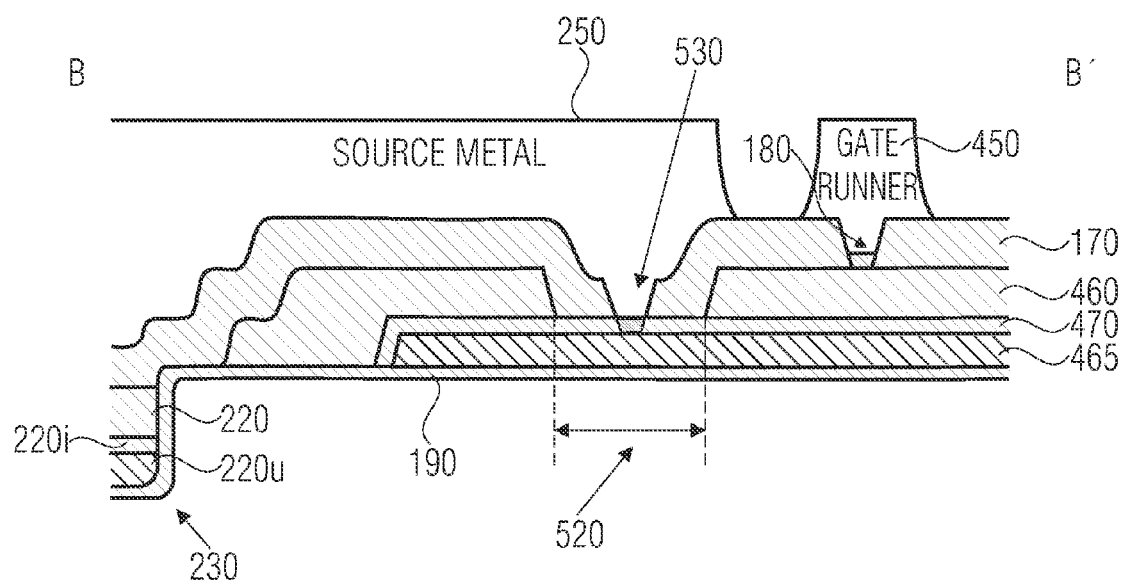
Figure 7C:
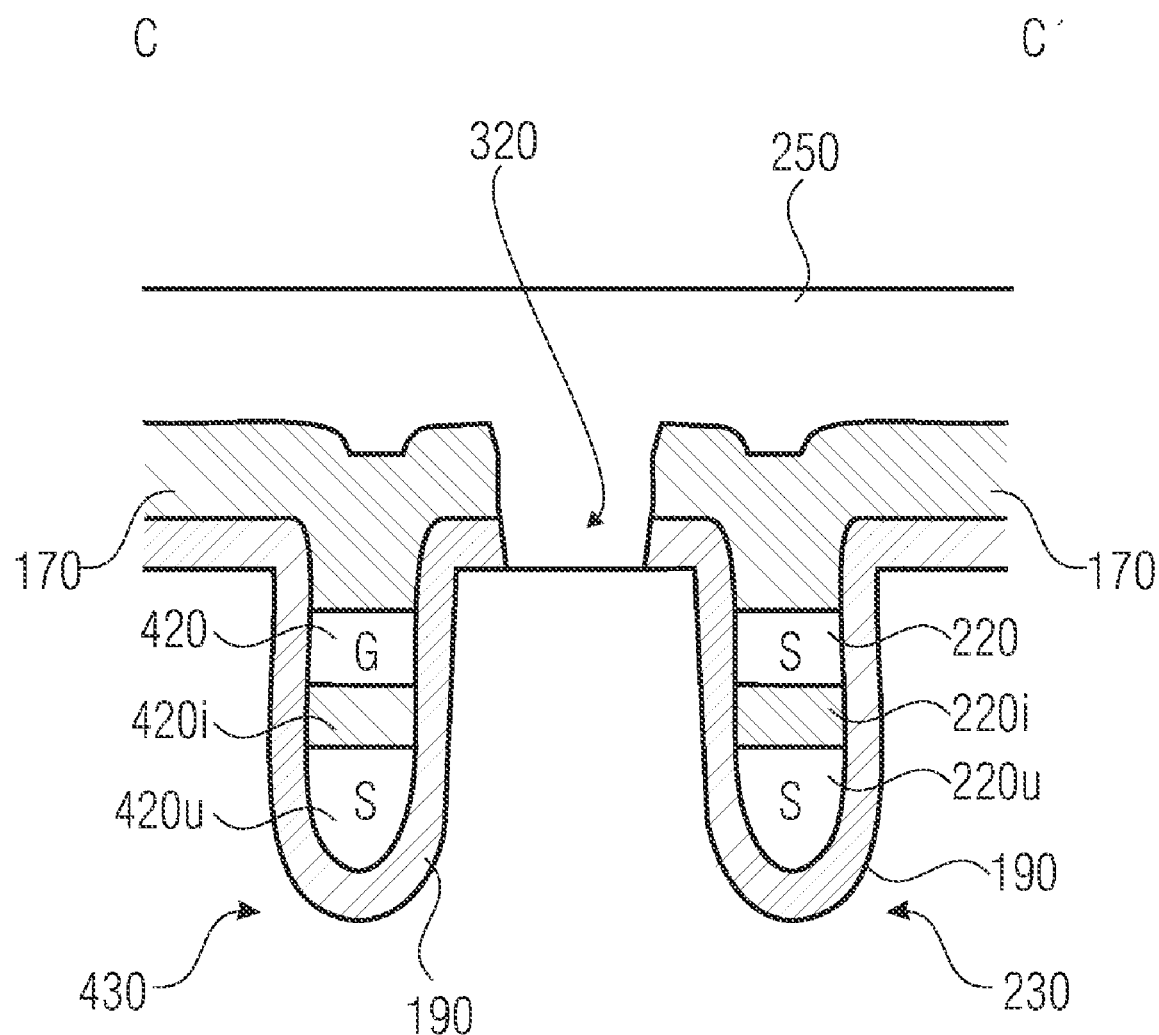

FIG. 6 illustrates the first region 510 of FIG. 5 as an enlarged representation, that is, is zoomed in on the chip corner of the high-speed variant of the trench transistor 100. FIGS. 7a, 7b, and 7c each illustrate a section through the trench transistor along one of the three lines illustrated as A-A', B-B' and C-C' in FIG. 6, FIG. 7a illustrating a section starting in the third trench 430, FIG. 7b illustrating a section starting in a second trench 230, and FIG. 7c illustrating a section which is perpendicular to the direction of the extension of the second trench 230 and of the third trench 430 through the actual cell field of the transistor.

In this context, the sections in FIGS. 7a, 7b, and 7c differ from the sections illustrated in FIGS. 2a, 2b, and 2c in that, with regard to the layer sequence, the trench transistor of FIGS. 5 to 9b in each of the trenches 130, 230, 430 includes two electrodes, more specifically the first electrode 120, the second electrode 220, and the third electrode 420, which are arranged within the same electrode plane with regard to the main surface of the substrate, and includes the first lower electrode 120u, the second lower electrode 220u, and the third lower electrode 420u, which are also arranged on a common electrode plane with regard to the main surface of the substrate, the two electrode planes of the electrodes 120, 220, 420, and of the electrodes 120u, 220u, 420u not being the same electrode planes, however.

In order to impede any undesired electrical contact between the upper electrode 120, 220, 420, respectively, with the lower electrode 120u, 220u, 420u, respectively, within the same trench 130, 230, 430, insulating layers are inserted between the two electrodes of a trench in each case, which may be oxide layers or nitride layers, for example. Thus, more specifically, the insulating layer 120i is arranged between the first electrode 120 and the first lower electrode 120u, the insulating layer 220i is arranged between the second electrode 220 and the second lower electrode 220u, and the insulating layer 420i is arranged between the third electrode 420 and the third lower electrode 420u.

This is illustrated, for example, by the section along line C-C' depicted in FIG. 7c. As was already the case in the context of FIG. 2c, here, too, there is a further contact opening 320 in the region of the mesa between the two trenches 230, 430, which—possibly by using a W plug or a poly plug—enables contacting of the semiconductor with the metal structure 250 in the area of the mesa. Because of its use as a contacting area, or bondpad, for the source terminal of the transistor, the metal structure 250 is also referred to as a source metal. To simplify the representation of the section 7c, details with regard to the doping, the implantation and the doping profile of the respective doping in the region of the mesa are also not illustrated. As was already illustrated in the context of FIG. 2c, the further insulating layer 190, which covers the bottoms of trenches 230, 430 in FIG. 7c and which is also arranged on the main surface of the substrate outside the trenches 230, 430, may absolutely differ, within the trench itself, with regard to thickness and/or composition, both within the trench itself, from trench to trench, and from trench to the main surface of the substrate. Only for the purposes of simplifying the representation, a single, identical insulating layer 190 is illustrated here. In addition, within the trench, the further insulating layer may also be removed and/or be supplemented or replaced by a further layer or layer sequence.

In addition, in FIG. 7c, the potential during operation of the transistor is schematically drawn into the four electrodes 220, 220u, 420, 420u in the form of the designations "S" and "G". As was explained above, the lower electrodes 220u, 420u are basically connected to the source potential within the context of the embodiment illustrated in FIGS. 5 to 9b, whereas it is only the second electrode 220 of the upper electrodes that is also connected to the source potential during operation ("S"). The first electrode (not illustrated in FIG. 7c) and the third electrode 420, by contrast, are connected to the gate potential during operation ("G").

In this context, it is also useful to mention that the representation selected in FIG. 7c is to be understood as a schematical representation. For example, with electrodes arranged on top of one another within a trench and which are separated from one another by an insulating layer which is thin compared to the thickness of the electrodes, there may quite possibly be a (partial) transfer of the topology of the trenches to the electrodes. It may happen, for example, that the electrodes are both U-shaped, it being quite possible for the electrodes within the trench to overlap with regard to a plane in parallel with the main surface of the substrate.

As was already mentioned, FIG. 7a illustrates the section along the straight line A-A' along the extension direction of the third trench 430. As was also illustrated by FIG. 7c, the third electrode 420 here is routed out of the trench 430 via the poly G 460, and is connected to the gate runner, or the metal structure, 450 via the contact hole 180 in the insulating layer 170—possibly via a W plug or a poly plug. The third lower electrode 420u, which is to be apply to source potential during operation, is routed out of the trench 430 via the poly S 465, and is connected to the metal structure, or the source metal, 250 via a recess, or hole, 520 in the poly G 460, and via a further contact hole 530 in the insulating layer 170. Here, the poly G 460 is separated from the poly S 465 by an insulating layer 470 which extends into the region of the trench 430 and is continued there as the insulating layer 420i.

Due to the different extensions of the electrodes 220, 220u in comparison with the extensions of the electrodes 420, 420u, the second electrode 220 and the second lower electrode 220u are not connected to the poly G 460 and the poly S 465, respectively, as is illustrated in FIG. 7b. In the section depicted in FIG. 7b, both the poly G 460 and the poly S 465 are separated from the second electrode 220 and the second lower electrode 220u by the insulating layer 470, on the one hand, and by the insulating layer 170. Due to the oblong shape of the contact hole 180 within the insulating layer, and due to the extension of the contact hole 530 within the insulating layer 470, it is even in the region of the section illustrated in FIG. 7b that the gate runner is electrically connected to the poly G 460, and the source metal 250 is electrically connected to the poly S 465.

FIG. 8 illustrates the second region 520 of FIG. 5 as an enlarged structure. More specifically, FIG. 8 zooms in on the source finger contact structure in the center of the chip, where the metallic conductor line 490 of the gate runner runs past.

Figure 9A:
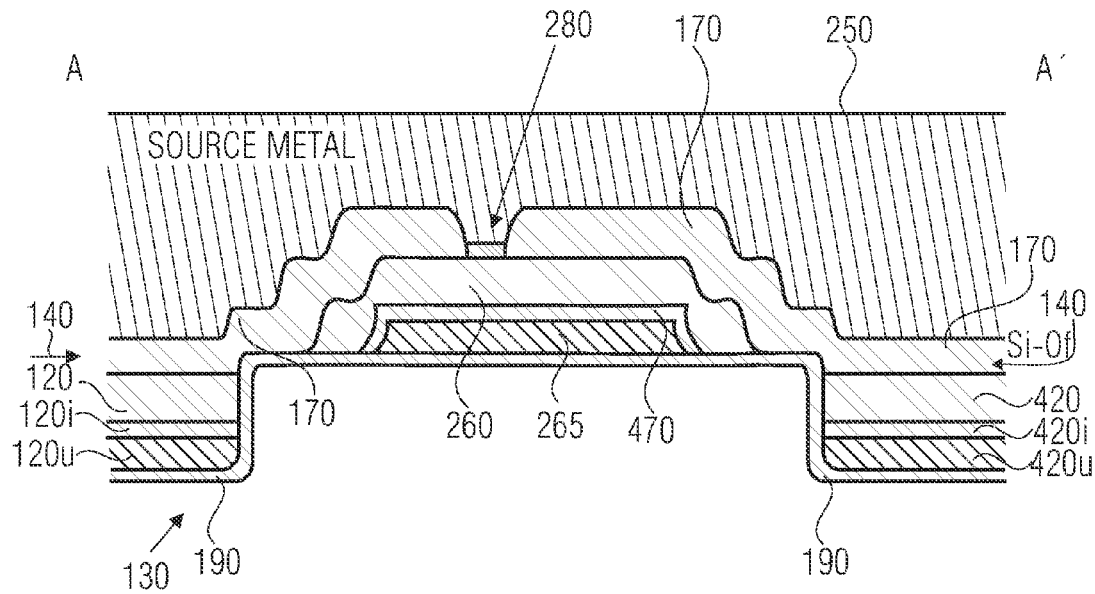
FIGS. 9a-9b illustrate two partial cross-sectional drawings of the electronic device of FIG. 5 in the detail illustrated in FIG. 8.

In addition, FIG. 8 illustrates that the first trenches 130 and the third trenches 430 do not extend as far as into the central region 500, but are arranged on a straight connecting line, as is illustrated, for example, by the lines designated by A-A' in FIG. 8, which at the same time mark the cross-section, depicted in FIG. 9a, of the trench transistor 100. The line in FIG. 8 which is marked as B-B' extends within the second trench 230 and illustrates the cross-section, illustrated in FIG. 9b, of the trench transistor 100. Here, the section depicted in FIG. 9b runs through the second trench 230, as is also illustrated by the connecting line B-B'.

In addition, FIG. 8 schematically illustrates the arrangement and the extension of the poly S 265 and that of the poly G 260 directly in the central region 500 along with the contact hole 280. Here, the poly G 260 includes a recess 530, also referred to as opening or hole in the poly G 260 and serving for contacting the second lower electrode 220u with the source metal, or with the metal structure, 250, as will be explained later on in the context of FIG. 9b.

FIG. 8 further illustrates that the trenches 230 which are fully applied to source potential in operation, or their electrodes 220, 220u are routed through below the source finger structure in the center of the chip and are contacted in this area. Both polys (poly S 265 and poly G 260), by means of which the second lower electrode 220u and the second electrode 220 are lifted above the main surface, or surface, of the substrate, and/or are routed out for contacting purposes, are connected, in the central region 500, to the metal structure 250, so that both may be applied to source or to source potential in operation. In this manner, the poly, which in the "regular case" (non-high-speed variant of the trench transistor) is applied to the gate potential in operation, is applied to source potential.

FIG. 9a, which depicts a cross-section of the trench transistor 100 starting in the region of the first trench 130 and ending in the region of the third trench 430, illustrates, on the basis of the layer sequence illustrated there, that the two upper electrodes 120, 420 and the two lower electrodes 120u, 420u of the two trenches 130, 430 are not connected to the poly G 260 and the poly S 265, and that both the first trench 130 with its two electrodes 120, 120u and the third trench 430 with its two electrodes 420, 420u do not extend into the central region 500.

Figure 9B:
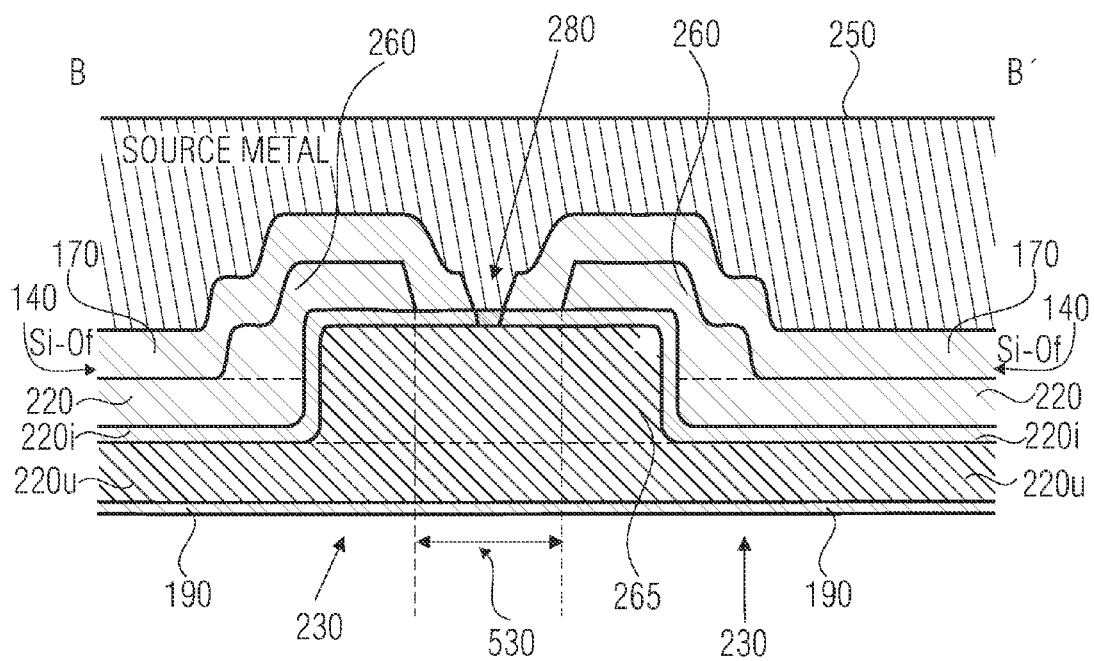

In addition, FIG. 9a illustrates that the poly S 265 is electrically insulated from the poly G 260 by the insulating layer 470 and is contacted—possibly via a W plug or a poly plug—to the source metal 250 above the surface of the substrate, which is marked by the two arrows 140 (Si OF) in FIG. 9a and FIG. 9b, via the contact hole 280 in FIG. 9b. In operation, the poly G 260 in the central region 500 may be applied to source potential via the contact hole 280 in FIG. 9a and the source metal 250, or the metal structure 250, as is also noted in FIG. 8.

FIG. 9b illustrates a cross-section of the electric device 100 along the connecting line B-B' which is illustrated in FIG. 8 and extends fully within the second trench 230, which extends through the central region 500, unlike the first trench and the third trench 430. FIG. 9b further illustrates that the second electrode 220 is routed out by means of the poly G 260 via the surface of the substrate (cf. marking 140), and is contacted with same. Since, as FIG. 9a has already illustrated, the poly G 260 is in connection with the source metal 250 through the contact hole 280 in the insulating layer 170, the second electrode is thus contacted due to the extension of the poly G 260 in the plane, which is illustrated in FIG. 8. In addition, the poly G 260 is electrically insulated, by the insulating layer 170, from the source metal 250 at least in the region of the cross-section illustrated in FIG. 9b.

As was already explained in connection with FIG. 8, the poly G 260 includes the recess 530 which eventually also enables contacting of the poly S 265 with the source metal 250 via the contact hole 280 in the insulating layer 170, and possibly via a W plug or an Si plug. In this manner, the poly S 265 may also be connected, in operation, to the source potential via the source metal, or the metal structure, 250. The poly S 265 here is in direct contact with the second lower electrode 220u, so that this electrode may be applied to the source potential during the operation of the transistor 100, as was already illustrated in FIG. 7c.

On principle, of course, in a further embodiment there is the possibility of contacting all poly S structures within the central region 500 of the electric device, of a trench transistor. In this case, it may be advisable to actually not have the first and possibly the third electrodes within the first and possibly the third trenches extend as far as into the central region, but there is the possibility of having at least the lower electrodes, respectively, of the possibly two trenches extend into the central region, possibly within the respective trenches, so that they may be directly contacted there in the central region.

The embodiment, depicted in FIGS. 5 to 9b, of a connecting structure in the event of a trench transistor 100 as an electric device thus illustrates the flexibility and possible space saving by saving a source metal ring in the event of the fast-switching high-speed variant in the case of a trench transistor. This embodiment thus illustrates how the trenches 230, which are applied to source potential during subsequent operation, with their electrodes 220, 220u are routed through, while trenches which are not applied to source are not routed through below the source finger structure in the region of the center of the chip at the same time. These trenches, more specifically the first trench 130 and the third trench 430, are also referred to as gate trenches, since they include at least one electrode, namely the first electrode 130 and the third electrode 430, respectively, which may be applied to gate potential in normal operation. These are interrupted, before the source finger structure, that is, do not extend as far as into the region thereof. These trenches, or their electrodes, are contacted from further outside, that is, for example from the chip edge. The embodiment illustrated in FIGS. 5 to 9b thus illustrates a trench structure which is interlocking in a comb-type manner and includes a patterned source finger contact structure having source finger and high-speed terminals.

Such an embodiment of a connecting structure may be employed, for example, in the case of trench transistors for smaller source/drain voltages (up to about 15 V), in the range of medium voltages (about 10 V to about 120 V), and in the range of higher voltages (above 100 V). Embodiments of a connecting structure thus enable trench transistors to be contacted, in a space-saving manner, with two or several electrodes within the trench, at least one electrode of which is to be applied to source potential in subsequent operation. By introducing the resulting source finger structure below the cell-field source metal, a contacting may be achieved which is space-saving, thus improves the specific on-resistance ($R_{on}$) and contacts at least one source electrode within the trench.

In the context of the present application, the metallic structures which are also provided for connecting the electric device to outer circuits, or to their housing, have been described, depicted and discussed, within the context of the embodiments described here, almost exclusively as rectangular structures, or as polygonal structures comprising angles of 90° in each case. Evidently, this does not represent any limitation with regard to the lower-lying contact structures or other structures, and only serves to simplify the figures and make them clearer. For example, any polygonal structures which even have angles which deviate from 90° are not only feasible, but are actually employed.

With embodiments of connecting structures, the first electrode at an edge region side end of the first trench extends, for example, by a distance farther to the edge region of the electronic device than the second electrode, the distance being larger than or equal to 10 µm.

Likewise, the second electrode extends, with regard to a further edge region opposite the edge region, by a further distance farther to the further edge region than does the first electrode, the further distance being larger than or equal to 10 µm.

With embodiments of a connecting structure, wherein the connection structure for the first potential and/or the connection structure for the second potential include(s) an electrically conductive contact structure extending vertically to the main surface of the substrate, the contact structure includes a metal or a semiconducting material. In this case, in embodiments of a connecting structure, the contact structure may include, for example, tungsten or doped polycrystalline silicon.

The connection structure of embodiments of a connecting structure for the first potential and/or the connection structure for the second potential additionally include(s) contacting areas, or bondpads. The contacting areas here include a metal.

In the case of embodiments of a connecting structure which include a plurality of first trenches having first electrodes associated respectively, and/or a plurality of second trenches having second electrodes associated respectively, the plurality of first trenches and the second trench, the plurality of first trenches and the plurality of second trenches, or the first trench and the plurality of second trenches are arranged in a regular manner. With embodiments of connecting structures comprising first, second, and third trenches, a first edge region and a second edge region, a central region, a first electrode within the first trench, a second electrode within the second trench, and a third electrode within the third trench, which are arranged in an electrode plane arranged with regard to a main surface of a substrate of the electronic device, and wherein the embodiments of the connecting structures include a plurality of first trenches having first electrodes associated respectively, and a plurality of third trenches having third electrodes associated respectively, and/or wherein the embodiments include a plurality of second trenches of the second electrodes associated respectively, the first trenches, second trenches, and third trenches are arranged in a regular manner.

Within the context of the present application, objects, such as structures, trenches, electrodes, metallizations, edges and edge regions, which are essentially opposite one another, are understood to mean those which are opposite both in a parallel manner and which also form a specific angle toward one another with regard to an direction, for example in the form of an orientation, characteristic direction or alignment. In addition, essentially opposite objects are also understood to mean those whose connecting line forms any angle desired with the objects concerned, or their advantageous directions. For example, essentially opposite edges and essentially opposite edge regions are not only understood to mean those which are opposite in parallel or are aligned in parallel and are opposite if they form an angle of 0° with one another with regard to their alignment (advantageous direction), and have, with regard to their connecting line, an angle of 90° with same in each case.

In some embodiments, for example, devices may include edges and edge regions which have angles ranging from 0° to 90° with each other regarding an advantageous direction, alignment or other characteristic direction. It shall be noted in this context that in the event that objects have an angle of more than 90°, but less than 180° with each other, they will also have an angle of 0° and 90° with each other because of the prevailing geometric conditions and the continuability of the (imagined) lines.

For example, such edges, structures or edge regions which are arranged perpendicularly to one another with regard to their orientation, that is, for example along two perpendicularly superimposed edges of a die or a chip, are also essentially opposite. In this case, the connecting line between these objects with their characteristic alignments forms an angle of 45°, for example, in each case.

In further embodiments, the devices include edges and edge regions which are not implemented as straight lines but are implemented to be bent or curved. Examples of such devices are round, circular or oval edge regions or edges of a device, which are implemented on a wafer, for example. In this case, the above explanations with regard to the orientation, the characteristic alignment or the advantageous direction are to be understood in the local sense in terms of a tangent on the curved edges, edge regions, structures or objects. For example, only one single radially designed device having a center or a central point of the device may be arranged on a round substrate or wafer. These embodiments, too, have mutually opposite edge regions which locally, in terms of a tangent, have an angle of 0° with regard to a connecting line through the center, or the midpoint, of the wafer in question.

Also with regard to straight connecting lines, or connecting lines running essentially straight, or essentially straight connecting lines, such a connecting line is understood to mean a connecting line, within the context of the present application, which extends not only in terms of a (mathematical) straight line, but may also run steadily also in the form of a bent line, in the mathematical sense. In some embodiments, for example, electrodes and/or trenches may thus also be arranged on meander-shaped connecting lines, spiral-shaped connecting lines, or other curved connecting lines.

In embodiments of a connecting structure for a device having a curvature or a bent edge or edge region at least on one side of the substrate, that is, for example, round substrates or wafers, the first trench and the second trench, or the first trenches and the second trenches, for example, each comprising their associated electrodes, may not only run in parallel. For example, with embodiments of a connecting structure of a round or oval device, the first trench and the second trench, or the first trenches and the second trenches, in each case along with their associated electrodes, may run toward a central point, for example the midpoint of the device. In this case, the first trenches and the second trenches no longer run in parallel, but form an angle also with regard to their orientations. In other embodiments of connecting structures for devices, the respective trenches and the associated electrodes may possibly also be arranged on arch-shaped lines.

In the event of an embodiment of a round device, for example, also the first trench and the third trench, or the first trenches and the third trenches, may be arranged on a wafer such that the essentially straight connecting lines of the respective trenches and electrodes no longer run in parallel, but run toward a common central point. In this case they thus form an angle with one other.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A semiconductor device including a connecting structure comprising:
    a first edge region;
    a second edge region opposite the first edge region;
    a central region arranged between the first edge region and the second edge region;
    first, second, and third trenches running toward the first edge region and the second edge region;
    a first electrode within the first trench, a second electrode within the second trench, and a third electrode within the third trench,
    the first, second, and third electrodes being arranged in an electrode plane arranged with regard to a main surface of a substrate of the electronic device;
    the first electrode extending farther into the first edge region than the second electrode and the third electrode;
    the third electrode extending farther into the second edge region than the first electrode and the second electrode;
    the first and third electrodes not extending into the central region;
    the first electrode and the third electrode being arranged on a straight connecting line;
    the second electrode being arranged offset to the connecting line; and
    the first electrode and the third electrode being contacted with a connection structure for a first potential, and the second electrode being connected with a connection structure for a second potential,
    wherein the second trench extends through the central region, wherein a first portion of the second trench and a portion of the first trench are arranged side by side in a lateral direction with respect to the main surface of the substrate and wherein a second portion of the second trench and a portion of the third trench are arranged side by side in the lateral direction with respect to the main surface of the substrate.

2. The semiconductor device of claim 1, wherein the connection structure for the first potential contacts the first electrode within the first edge region and the third electrode within the second edge region.

3. The semiconductor device of claim 1, wherein the connection structure for the first potential and/or the connection structure for the second potential comprise(s) a contacting area.

4. The semiconductor device of claim 1, wherein the first trench further comprises a first lower electrode arranged below the first electrode in relation to the main surface of the substrate, and wherein the third trench further comprises a third lower electrode arranged below the third electrode in relation to the main surface of the substrate, the first lower electrode and the third lower electrode being arranged on a second electrode plane within the first trench and the third trench, respectively.

5. The semiconductor device of claim 4, wherein the first lower electrode and the third lower electrode are connected to the connection structure for the second potential.

6. The semiconductor device of claim 1, wherein the second trench further comprises a second lower electrode arranged below the second electrode in relation to the main surface of the substrate, the second electrode and the second lower electrode being arranged on two electrode planes within the second trench.

7. The semiconductor device of claim 1 further comprising a plurality of first trenches having first electrodes associated respectively, and a plurality of third trenches having third electrodes associated respectively, and/or a plurality of second trenches having second electrodes associated respectively.

8. The semiconductor device of claim 7, wherein a second trench is arranged adjacent to both sides of first and third trenches, and/or first and third trenches, respectively, are arranged adjacent to both sides of a second trench.

9. The semiconductor device of claim 1, wherein at least one insulation layer is arranged between the first electrode and the substrate, the second electrode and the substrate and the third electrode and the substrate.

10. The semiconductor device of claim 1, wherein the first and third electrodes are gate electrodes and wherein the second electrode is a source electrode.

11. The semiconductor device of claim 1 comprising a plurality of second trenches and second electrodes, wherein central portions of the second electrodes are connected to a common metal structure.

* * * * *